(12) United States Patent
Doris et al.

(10) Patent No.: US 9,059,243 B2
(45) Date of Patent: Jun. 16, 2015

(54) SHALLOW TRENCH ISOLATION STRUCTURES

(75) Inventors: Bruce B. Doris, Brewster, NY (US); Kangguo Cheng, Schenectady, NY (US); Balasubramanian S. Haran, Watervliet, NY (US); Ali Khakifirooz, Mountain View, CA (US); Pranita Kulkarni, Slingerlands, NY (US); Arvind Kumar, Chappaqua, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 13/531,654

(22) Filed: Jun. 25, 2012

(65) Prior Publication Data

US 2013/0341754 A1    Dec. 26, 2013

(51) Int. Cl.
*H01L 21/70* (2006.01)
*H01L 21/762* (2006.01)

(52) U.S. Cl.
CPC .... *H01L 21/76224* (2013.01); *H01L 21/76283* (2013.01)

(58) Field of Classification Search
CPC ............ H01L 27/1203; H01L 29/0642; H01L 29/0649
USPC ............. 257/347, 506, E29.02, 510; 438/435
See application file for complete search history.

(56) References Cited

U.S. PATENT DOCUMENTS

| | | | |
|---|---|---|---|
| 5,679,599 A | 10/1997 | Mehta | |
| 6,245,637 B1 | 6/2001 | Tsai | |
| 6,352,897 B1 | 3/2002 | Sung | |
| 6,750,117 B1 * | 6/2004 | Hung et al. | 438/437 |
| 6,939,780 B2 * | 9/2005 | Yun et al. | 438/437 |
| 7,268,056 B2 | 9/2007 | Sumino et al. | |
| 7,279,393 B2 | 10/2007 | Nanda et al. | |
| 7,348,634 B2 | 3/2008 | Furukawa et al. | |
| 7,705,417 B2 | 4/2010 | Oishi | |
| 7,741,188 B2 | 6/2010 | Dyer et al. | |
| 2001/0009805 A1 | 7/2001 | Ha et al. | |
| 2006/0220144 A1 | 10/2006 | Anezaki et al. | |
| 2007/0132056 A1 | 6/2007 | Williams | |
| 2008/0268589 A1 | 10/2008 | Farber et al. | |
| 2010/0052094 A1 | 3/2010 | Carter et al. | |
| 2011/0061810 A1 * | 3/2011 | Ganguly et al. | 156/345.27 |

OTHER PUBLICATIONS

C-Y. Hu et al., "Shallow Trench Isolation Stress Modification by Optimal Shallow Trench Isolation Process for Sub-65-nm Low Power Complementary Metal Oxide Semiconductor Technology," Journal of Vacuum Science Technology B, Mar./Apr. 2010, pp. 391-397, vol. 28, No. 2.
PCT International Search Report and Written Opinion, dated May 16, 2013, for counterpart PCT Application PCT/US2013/030728.

* cited by examiner

*Primary Examiner* — Kenneth Parker
*Assistant Examiner* — John Lin
(74) *Attorney, Agent, or Firm* — Vazken Alexanian; Ryan, Mason & Lewis, LLP

(57) ABSTRACT

Shallow trench isolation structures are provided for use with UTBB (ultra-thin body and buried oxide) semiconductor substrates, which prevent defect mechanisms from occurring, such as the formation of electrical shorts between exposed portions of silicon layers on the sidewalls of shallow trench of a UTBB substrate, in instances when trench fill material of the shallow trench is subsequently etched away and recessed below an upper surface of the UTBB substrate.

12 Claims, 8 Drawing Sheets

US 9,059,243 B2

SHALLOW TRENCH ISOLATION STRUCTURES

TECHNICAL FIELD

The field generally relates to STI (shallow trench isolation) structures and, in particular, STI structures for UTBB (ultra-thin body and buried oxide) semiconductor devices.

BACKGROUND

With SOI (silicon-on-insulator) technology, a thin silicon layer is formed over an insulating layer, such as silicon oxide, which in turn is formed over a bulk substrate. The insulating layer is referred to as a BOX (buried oxide) layer. For a single BOX SOI wafer, the thin silicon layer is divided into active regions using STI structures, which intersect the BOX layer. In general, the STI structures are fabricated by etching a pattern of trenches in the SOI substrate below the BOX layer, and depositing one or more layers of dielectric material to fill the trenches. The STI structures define the active regions, and provide isolation between active regions in the upper silicon layer of the SOI in which devices such as FETs (field effect transistors) are formed. The gate structures of FETs are formed on top of the thin silicon layer, for example, by depositing a gate dielectric layer and a gate electrode layer on the top surface of the thin silicon, followed by photolithographic patterning, and etching to form gate stack structures. The sources and drains of field effect transistors are then formed, for example, by ion implantation of N-type and/or P-type dopant material into the thin silicon layer using a gate stack structure to self-define a channel region.

In a single BOX SOI structure, the silicon layer underlying the BOX layer can be used as a back gate layer under the active regions, wherein the BOX layer serves as the back-gate dielectric, wherein the back gate can be defined by either P+ or N+ implantation. FETs with back gates typically use a UTBB (Ultra-Thin Body and Box) substrate having a relatively thin upper silicon layer and thin BOX layer to enable fully depleted device operation with a threshold voltage that is responsive to a back gate voltage applied to the back gate (lower silicon layer). FETs fabricated using UTBB technology with back gates have significant advantages such as, for example, reduced short channel effects, less threshold variability due to body doping fluctuations, and ability to use the back gate voltage to adjust the threshold voltage However, as the thickness of the BOX layer is reduced for UTBB structures, the potential for electrical shorts between the upper and lower silicon layers of the device increases as a result of various processing steps that can etch down the trench fill material and expose the upper and lower surfaces of the upper and lower silicon layers on the sidewalls of the shallow trench.

SUMMARY

Aspects of the invention include STI (shallow trench isolation) structures and, in particular, STI structures for use with UTBB (ultra-thin body and buried oxide) semiconductor substrates, which prevent defect mechanisms from occurring, such as the formation of electrical shorts between exposed portions of silicon layers on the sidewalls of shallow trench of a UTBB substrate, in instances when trench fill material of the shallow trench is subsequently etched away and recessed below an upper surface of the UTBB substrate.

In one aspect of the invention, a semiconductor device includes a semiconductor substrate having a first silicon layer, a second silicon layer, and a buried oxide layer disposed between the first silicon layer and the second silicon layer, a high-k gate dielectric layer formed on the first silicon layer, and a shallow trench isolation structure formed in the semiconductor substrate. The shallow trench isolation structure includes a shallow trench formed through the first silicon layer, the buried oxide layer and partially through the second silicon layer, a first liner conformally lining the shallow trench, and a trench fill material disposed in the shallow trench. The first liner is foamed of a material having etch selectivity with regard to the trench fill material.

In another aspect, an upper sidewall portion of the shallow trench isolation structure includes a void region disposed between an upper surface of the first liner and an upper surface of the first silicon layer, wherein the void region isolates the first liner from the high-k gate dielectric layer foamed on the first silicon layer.

In another aspect of the invention, a semiconductor device includes a semiconductor substrate comprising a first silicon layer, a second silicon layer, and a buried oxide layer disposed between the first silicon layer and the second silicon layer, a high-k gate dielectric layer formed on the first silicon layer, and a shallow trench isolation structure formed in the semiconductor substrate. The shallow trench isolation structure includes a shallow trench formed through the first silicon layer, the buried oxide layer and partially through the second silicon layer, a first liner conformally lining the shallow trench, and a trench fill material disposed in the shallow trench. The first liner is formed of a material having etch selectivity with regard to the trench fill material, and the first liner is recessed below an upper surface of the first silicon layer on the upper sidewalls of the shallow trench. Further, an insulating material is disposed on the upper sidewalls of the shallow trench between the first liner and the upper surface of the first silicon layer. The insulating layer isolates the first liner from the high-k gate dielectric layer.

In yet another aspect of the invention, a method of foaming a semiconductor device includes forming a high-k gate dielectric layer on a semiconductor substrate having a first silicon layer, a second silicon layer, and a buried oxide layer disposed between the first silicon layer and the second silicon layer, and forming a shallow trench isolation structure formed in the semiconductor substrate. The process of forming a shallow trench isolation structure includes forming a shallow trench in the substrate through the first silicon layer, the buried oxide layer and partially through the second silicon layer, forming a first liner conformally lining the shallow trench, and filling the shallow trench with a trench fill material. The first liner is formed of a material having etch selectivity with regard to the trench fill material. In another aspect, forming the shallow trench isolation structure further includes etching the first liner to recess the first liner down in the shallow trench and create a void region disposed between an upper recessed surface of the first liner and an upper surface of the first silicon layer, wherein the void region isolates the first liner from the high-k gate dielectric layer formed on the first silicon layer.

In another aspect of the invention, a method of forming a semiconductor device includes forming a high-k gate dielectric layer on a semiconductor substrate having a first silicon layer, a second silicon layer, and a buried oxide layer disposed between the first silicon layer and the second silicon layer, and forming a shallow trench isolation structure formed in the semiconductor substrate. The process of forming a shallow trench isolation structure includes forming a shallow trench in the substrate through the first silicon layer, the buried oxide layer and partially through the second silicon layer, forming a first liner conformally lining the shallow trench, and filling the shallow trench with a trench fill material, etching the first liner to recess the first liner down in the shallow trench and create a void region disposed between an upper recessed surface of the first liner and an upper surface of the first silicon layer, and filling the void region with an insulating material. The first liner is formed of a material having etch selectivity with regard to the trench fill material, and the insulating material isolates the first liner from the high-k gate dielectric layer formed on the first silicon layer.

These and other aspects and features of the present invention will become apparent from the following detailed description of preferred embodiments thereof, which is to be read in connection with the accompanying drawings

BRIEF DESCRIPTION OF THE DRAWINGS

FIGS. 4A, 4B, 4C, 4D, 4E, 4F, 4G, 4H, 4I, 4J, 4K, 4L, and 4M schematically illustrate methods for fabricating a semiconductor device having STI structure according to aspects of the invention, wherein:

FIG. 4A is a cross-sectional view of a semiconductor device at an initial stage of fabrication wherein a substrate comprises a first silicon layer, a second silicon layer, and a BOX layer disposed between the first and second silicon layers, FIG. 4B is a cross-sectional view of the structure of FIG. 4A after forming a pad oxide layer on the substrate and forming a pad nitride layer on the pad oxide layer, FIG. 4C is a cross-sectional view of the structure of FIG. 4B after forming a photolithographic mask on the pad nitride layer which defines an opening for etching a shallow trench, FIG. 4D is a cross-sectional view of the structure of FIG. 4C after etching the pad nitride and oxide layers and substrate to form a shallow trench, FIG. 4E is a cross-sectional view of the structure of FIG. 4D after removing the photolithographic mask and forming a first liner in the shallow trench, FIG. 4F is a cross-sectional view of the structure of FIG. 4E after foaming a second liner in the shallow trench, FIG. 4G is a cross-sectional view of the structure of FIG. 4F after depositing a blanket layer of insulating material to fill the shallow trench, FIG. 4H is a cross-sectional view of the structure of FIG. 4G after planarizing the surface of the structure to remove portions of the insulating trench fill material and second liner material down to the pad nitride layer, FIG. 4I is a cross-sectional view of the structure of FIG. 4H after performing a liner recess etch process to remove portions of the second liner material present on the upper sidewalls of the shallow trench and faun a recess region in an upper portion of the shallow trench, FIG. 4J is a cross-sectional view of the structure of FIG. 4I after removing the pad nitride layer and depositing a layer of insulating material to fill the recess region within the shallow trench, FIG. 4K is a cross-sectional view of the structure of FIG. 4J after removing the portion of the layer of insulting material down to the pad oxide layer, FIG. 4L is a cross-sectional view of the structure of FIG. 4K after removing the pad oxide layer, and FIG. 4M is a cross-sectional view of the structure of FIG. 4L after forming a gate dielectric layer on top of the substrate.

DETAILED DESCRIPTION OF PREFERRED EMBODIMENTS

Preferred embodiments of the invention will now be described in further detail with reference to STI structures for use with UTBB (ultra-thin body and buried oxide) semiconductor substrates, which prevent defect mechanisms from occurring, such as the formation of electrical shorts between exposed portions of silicon layers on the sidewalls of shallow trench of a UTBB substrate, in instances when trench fill material of the shallow trench is subsequently etched away and recessed below an upper surface of the UTBB substrate.

Figure 1:
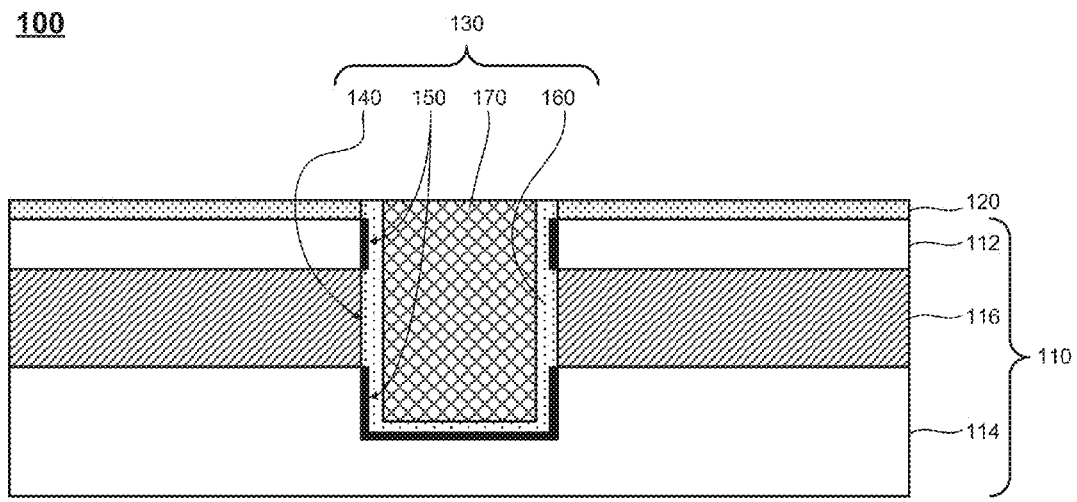
FIG. 1 is a cross-sectional view of a semiconductor device having a STI structure according to one aspect of the invention.

FIG. 1 is a cross-sectional view of a semiconductor device having a STI structure according to one aspect of the invention. In general, the semiconductor device 100 shown in FIG. 1 includes a semiconductor substrate 110 comprising a first silicon layer 112, a second silicon layer 114, and a buried oxide layer 116 (BOX layer) disposed between the first silicon layer 112 and the second silicon layer 114. A high-k gate dielectric layer 120 is formed on the first silicon layer 112. A shallow trench isolation structure 130 (STI structure) is formed in the semiconductor substrate 110. The STI structure 130 comprises a shallow trench 140 formed completely through the first silicon layer 112 and buried oxide layer 116, and partially through the second silicon layer 114. The STI structure 130 further comprises a first liner 150, a second liner 160, and a trench fill material 170.

In the device geometry of FIG. 1, the first liner 150 is formed on exposed portions of the first silicon layer 112 and second silicon layer 116 on the sidewalls and bottom walls of the shallow trench 140. The first liner 150 may be an oxide layer, such as an oxynitride layer, that is grown on the exposed surfaces of the silicon layers 112 and 114 in the shallow trench 140. The second liner 160 is conformally formed on the sidewall and bottom surfaces of the shallow trench 140 on top of the first liner 150 and on the exposed surfaces of the BOX layer 116. The trench fill material 170 is formed over the second liner 160 filling the shallow trench 140. The trench fill material 170 may be formed of any suitable insulating material such as silicon dioxide ($SiO_2$).

In accordance with principles of the invention, the second liner 160 is made of a material that has a high etch selectivity with regard to the trench fill material 170. For instance, the second liner 160 may be made of a high-K dielectric material such as hafnium silicate and hafnium oxide. In this regard, the second liner 160 serves as a barrier, or otherwise provides etch stop protection, to protect the sidewalls surfaces of the shallow trench 140 and prevent defect mechanisms for occurring (such as formation of shorts between exposed portions of the first silicon layer 112 and the second silicon layer 114 in the trench 140) in instances when the trench fill material 170 is subsequently etched away and recessed below the upper surface of the substrate 110.

By way of specific example, after formation of the STI structure 130, the trench fill material 170 can be undesirably etched down (recessed) within the trench 140 as a result of one or more subsequent wet cleaning processes (wet etching with HF) that are performed as part of pre-silicon epitaxy and/or pre-gate dielectric cleaning steps, for example. In a UTBB device according to an aspect of the invention, the thickness of the first silicon layer 112 may be about 6 nm and the thickness of the BOX layer 116 may be in a range of 5-75 nm. In this regard, as a result of the subsequent wet etching processes, the trench fill material 170 can be recessed in the trench 140 to a level that is actually below the BOX layer 116. With conventional STI structures that do not include the protective liner 160 as shown in FIG. 1, this recessing of the trench fill material below the level of the BOX layer 114 can expose portions of the first and second silicon layers 112 and 114 within the trench, resulting in potential short defects between the first and second silicon layers 112 and 114.

For example, in semiconductor fabrication, a silicon epitaxial deposition, or epitaxy, process can be performed to grow a thin layer of single-crystal silicon over a single-crystal silicon substrate. A silicon epitaxy process can be performed, for example, to selectively grow additional silicon in the source and drain regions of the semiconductor substrate to increase the thickness of the first silicon layer 112 outside the channel region to achieve lower resistance source and drain regions. However, during a silicon epitaxy process, if the first and second silicon layers 112 and 114 are exposed within the trench 140 (due to the recessed trench fill material), the epitaxy process can cause silicon to grow on the sidewalls of the shallow trench and cause an electrical (short) connection between the first and second silicon layers 112 and 114 of the substrate 110. Likewise, similar defect mechanisms can occur during a silicide process, when silicide is grown on the surface of the first silicon layer 112 of the substrate 110 in the source/drain regions to form low resistance source/drain contacts.

Moreover, these defect mechanisms can occur during subsequent BEOL (back end of line) processing, for example, when forming metallic via contacts to drain and source regions. In this process, a first layer of interlevel insulating material (e.g., oxide) is deposited over the active surface of the semiconductor substrate and then via holes are etched in the first layer of insulating material down to device contacts. In instances where the via holes have some overlap with the STI structures and the via holes are over-etched, the trench fill material within the shallow trench can be also be etched away and recessed down in the shallow trench such that the first and second silicon layers 112 and 114 are exposed on the sidewalls of the trench. During s subsequent via hole fill process, the metallic material filling the via hole can also fill in the upper part of the shallow trench and cause an electrical connection (short) between the exposed surfaces of the first and second silicon layers 112 and 114 within the shallow trench.

To avoid these defect mechanisms, in accordance with principles of the invention, the second liner 160 is employed to protect the sidewalls of shallow trench 140 from being exposed due to subsequent processing steps that cause the trench fill material 170 to be etched away and recessed down in the shallow trench 140. By forming the second liner 160 with a material that is more resistant to subsequent wet etching processes, for example, the second liner 160 can serve as a protective barrier layer that prevents exposure of the first and second silicon layers 112 and 114 on the sidewalls of the shallow trench 140 when the trench fill material 170 is over etched and recessed down below the BOX layer 116.

In the exemplary embodiment shown in FIG. 1, the second liner 160 is shown to be in contact with the high-k gate dielectric layer 120. When the second liner 160 is made of a high-k dielectric material, the second liner 160 can act as a conductive pathway for oxygen, in particular, oxygen found in the trench fill material 170 (e.g., $SiO_2$), causing high-K gate dielectric layer 120 to be contaminated with additional oxygen atoms. This oxygen contamination of the gate dielectric layer 120 can cause undesirable, random shifts in the threshold voltages of the FETs having gate structures formed by portions of the oxygen contaminated gate dielectric layer 120. Thus, in accordance with other aspect of the invention, STI structures are provided to provide isolation between the second liner 160 and the gate dielectric layer 120.

Figure 2:
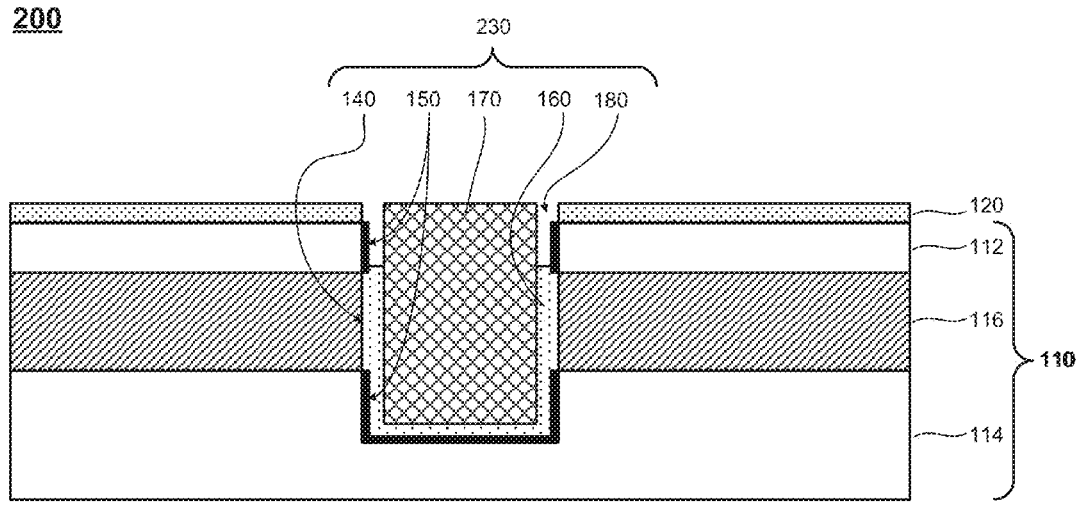
FIG. 2 is a cross-sectional view of a semiconductor device having a STI structure according to another aspect of the invention.

For instance, FIG. 2 is a cross-sectional view of a semiconductor device having a STI structure according to another aspect of the invention, which provides isolation between the trench liner 160 and the gate dielectric layer 120. In particular, FIG. 2 shows a semiconductor device 200 which is similar to the semiconductor device 100 shown in FIG. 1, except that the second liner 160 of the STI structure 130 is recessed down below the surface of the substrate 110, thereby forming a recess region 180 (or void) in the upper region of the shallow trench 140. The recess region 180 provides isolation between the trench liner 160 and the gate dielectric layer and prevents oxygen from diffusing from the trench fill material 170 to the high-k gate dielectric layer 120 through the high-k trench liner 160. The recess region 180 is formed by etching down the portion of the second liner 160 in the upper region of the STI structure 130 so that the gate dielectric layer 120 does not make contact to the trench liner 160 when the gate dielectric layer 120 is subsequently formed. In the exemplary embodiment of FIG. 2, the trench liner 160 is preferably recessed down any suitable depth that is sufficient to prevent contact between the trench liner 160 and the gate dielectric layer 120, while providing the desired etch protective layer as discussed above to prevent exposure of the silicon layers 112 and 114 on the sidewalls of the shallow trench 140.

Figure 3:
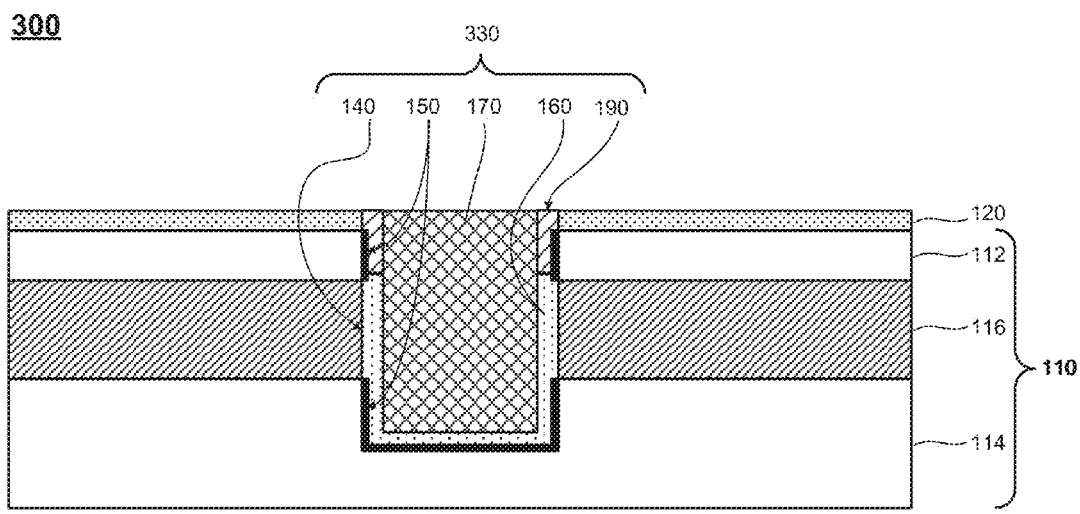
FIG. 3 is a cross-sectional view of a semiconductor device having a STI structure according to another aspect of the invention.

FIG. 3 is a cross-sectional view of a semiconductor device having a STI structure according to another aspect of the invention, which provides isolation between the trench liner 160 and the gate dielectric layer 120. In particular, FIG. 3 shows a semiconductor device 300 which is similar to the semiconductor device 200 shown in FIG. 2, except that the recess region 180 is filled with an insulating material (divot fill) 190, such as silicon nitride or any other material, which does not conduct any appreciable amount of oxygen from the trench fill material 170 to the high-K gate dielectric layer 120. The divot fill 190 effectively isolates the second liner 160 and the high k gate dielectric 120 and prevents diffusion of oxygen from the high-k trench liner 160 to the high-K gate dielectric layer 120.

Figure 4A:
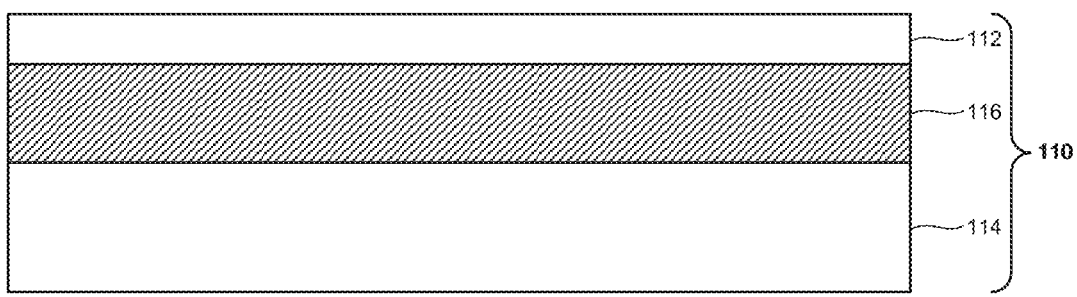

FIGS. 4A, 4B, 4C, 4D, 4E, 4F, 4G, 4H, 4I, 4J, 4K, 4L, and 4M schematically illustrate methods for fabricating a semiconductor device having STI structure according to aspects of the invention. In particular, FIGS. 4A, 4B, 4C, 4D, 4E, 4F, 4G, 4H, 4I, 4J, 4K, 4L and 4M are cross-sectional views of portions of the semiconductor devices 100, 200 and 300 of FIG. 1 at various stages of fabrication. FIG. 4A is a cross-sectional view of the semiconductor devices 100, 200 and 300 at an initial stage of fabrication wherein a substrate 110 comprises a first silicon layer 112, a second silicon layer 114, and a BOX layer 116 disposed between the first and second silicon layers 112 and 114. The substrate 110 may be fabricated by forming an oxide layer (the BOX layer 116) on a silicon substrate (the second silicon layer 114) and then forming a thin silicon layer (the first silicon layer 112) on the insulating layer 116. The first silicon layer 112 may have a thickness in a range of about 5 nm to about 25 nm. The BOX layer 116 may have a thickness in a range of about 5 nm to about 75 nm. The thickness of the second silicon layer 114 may be in a range of about 100 um to about 200 um. In a UTBB design, the BOX layer 116 is sufficiently thin to allow the second silicon layer 114 to be used as a back gate, while providing a sufficient insulation between the silicon layers 112 and 114.

Figure 4B:
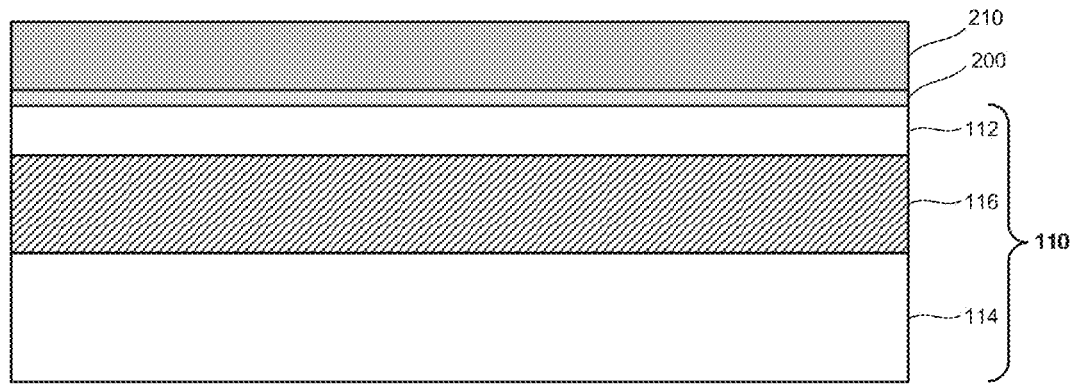

A next step in the exemplary fabrication process comprises sequentially forming a pad oxide layer and a pad nitride layer over the substrate 110. FIG. 4B is a cross-sectional view of the structure of FIG. 4A after forming a pad oxide layer 200 on the substrate 110 and forming a pad nitride layer 210 on the pad oxide layer 200. The pad oxide layer 200 and the pad nitride layer 210 can be formed using well-known techniques. For instance, in one preferred embodiment, the pad oxide layer 200 is formed using a thermal oxidation process. The thickness of the pad oxide layer 200 can be in a range of about 5 nm to about 8 nm. The pad nitride layer 210 can be formed by depositing silicon nitride using a CVD (chemical vapor deposition) process such as LPCVD or PECVD. The pad nitride layer 210 can be fanned with a thickness in a range of about 20 nm to about 80 nm. The pad oxide layer 200 and the pad nitride layer 210 serve as sacrificial material layers in the exemplary fabrication process. The pad oxide layer 200 serves as a buffer layer between the pad nitride layer 210 and the first silicon layer 112.

Figure 4C:
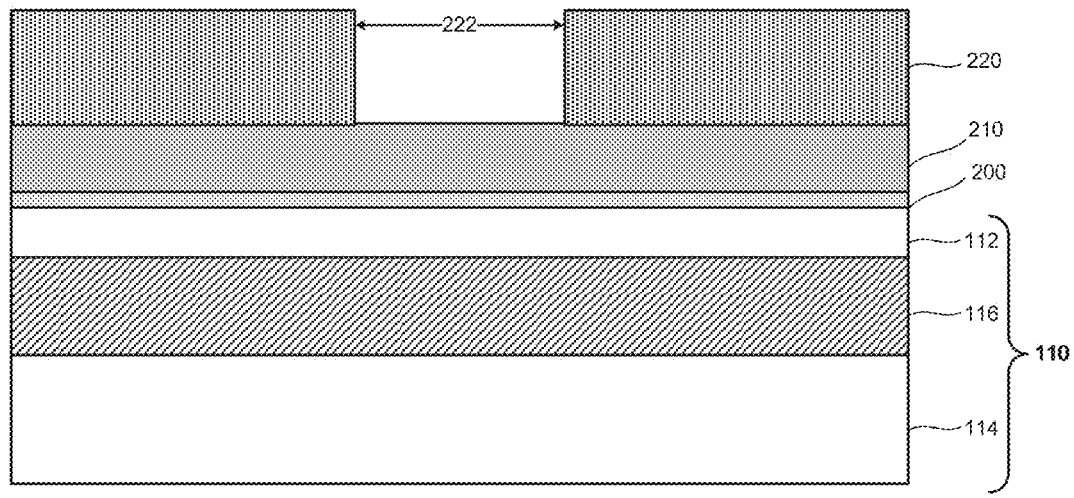
Figure 4D:
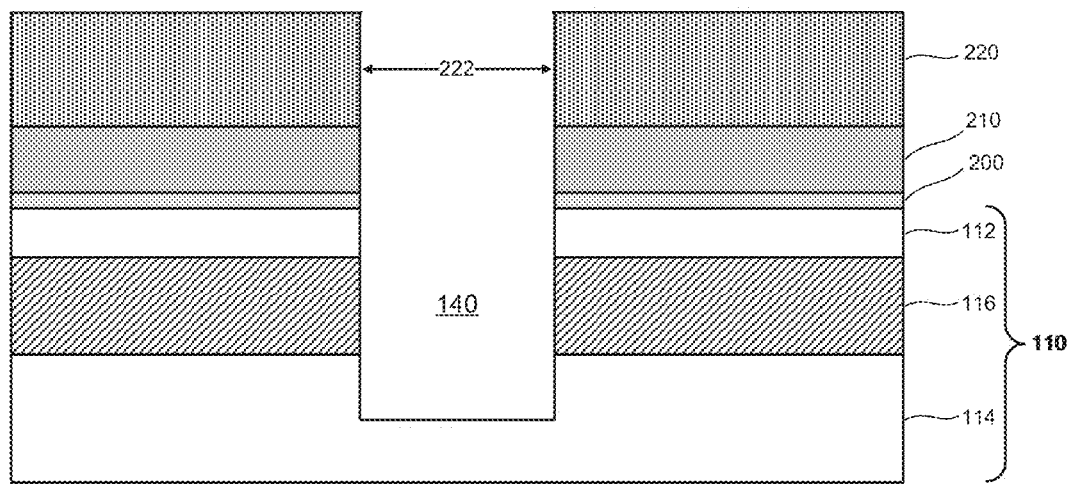
Figure 4E:
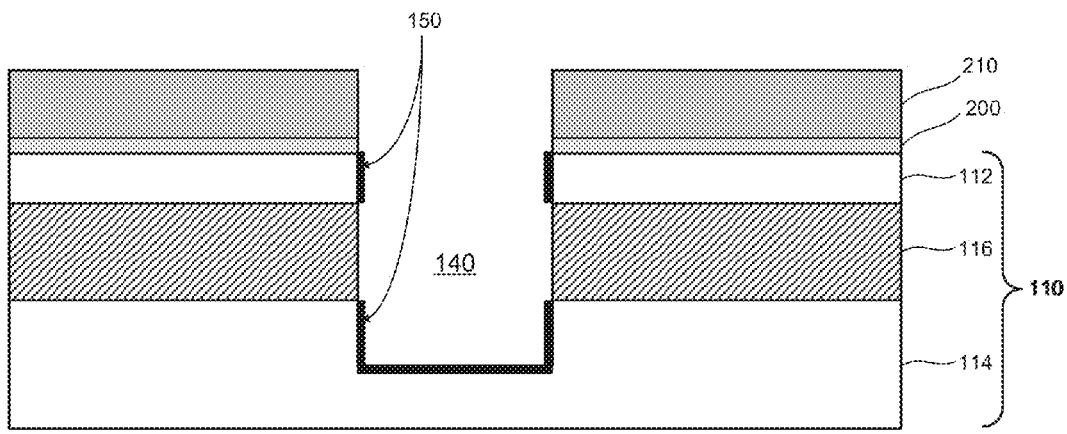

A next step in the exemplary fabrication process is to form shallow trenches in the substrate 110. In one aspect of the invention, the shallow trenches are formed using a standard photolithography process to form a lithographic mask and etch shallow trenches using the lithographic mask as an etch mask. FIG. 4C is a cross-sectional view of the structure of FIG. 4B after forming a photolithographic mask 220 (by patterning a photoresist layer using known techniques) on the pad nitride layer 210 which defines an opening 222 for etching a shallow trench structure. FIG. 4D is a cross-sectional view of the structure of FIG. 4C after etching the pad nitride and oxide layers and substrate to form a shallow trench 140. As shown in FIG. 4E, the shallow trench 140 is formed in the substrate 110 by etching completely through the first silicon layer 112, the BOX layer 116 and partially through the second silicon layer 114. The etch process may be performed by sequentially etching various layers 210, 200, 112, 16 and 112 using dry plasma etching or using any other etch processes and etch environments that are commonly used to etch the materials forming the various layers 210, 200, 112, 16 and 112.

After forming the shallow trenches 140, a next step in the exemplary fabrication process is to remove the photolithographic mask 220 and line the shallow trench 140 with an insulating material. FIG. 4E is a cross-sectional view of the structure of FIG. 4D after removing the photolithographic mask 220 and forming a first liner 150 in the shallow 140. The photolithographic mask 220 can be removed using dry plasma oxygen ash process followed by a wet cleaning process. After removal of the photolithographic mask 220, the first liner 150 can be formed on the exposed surfaces of the first and second silicon layers 112 and 114 in the shallow trench 140 using a thermal oxidation process to form a thin thermal oxide liner. The process of forming the first liner 150 can be performed in a furnace or alternatively via a rapid thermal CVD tool, in the presence of a nitrogen or oxygen environment. A thermal oxidation process will convert the exposed surfaces of the silicon layers 112 and 114 into silicon dioxide, $SiO_2$. The silicon dioxide trench liner 150 can be converted to an oxynitride liner if an ammonium (NH3) bake is used after the oxidation process. The oxynitride trench liner 150 protects the exposed surfaces of the silicon layers 112 and 114 in the shallow trench 140. The thickness of the oxynitride trench liner 150 can be in the range of about 0.5 nm to about 4 nm.

Figure 4F:
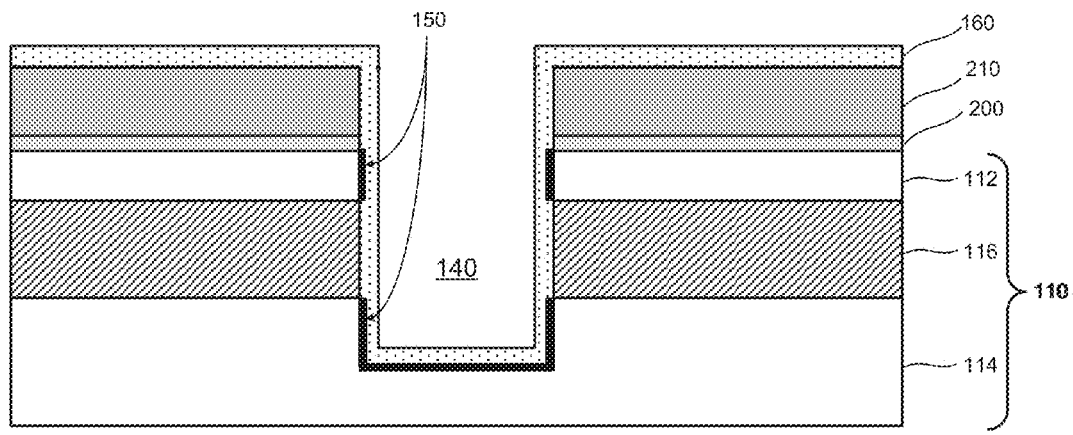

A next step in the exemplary fabrication process is to form a second trench liner on the sidewalls and bottom walls of the shallow trench 140. FIG. 4F is a cross-sectional view of the structure of FIG. 4E after conformally depositing a second layer of insulating material to form the second liner 160 in the shallow trench 140. The second liner 160 can be made of any suitable material that has a high etch selectivity with regard to the oxide material that is subsequently used to fill the shallow trench 140. For instance, the second liner 160 may be formed with material such as $TiO_2$, $HfO_2$, HfSiO, and HfSiON, any other high-K dielectric/insulating materials. The second liner 160 may be deposited using processes such as ALD (Atomic Layer Deposition) or MOCVD (Metal Organic Chemical Vapor Deposition). As noted above, the second liner 160 serves as an etch protection layer to protect the surfaces of the first and second silicon layers 112 and 114 from exposure in the shallow trench 140 in circumstances where a trench fill material is etched away during subsequent processing steps. The second liner 160 is made of material with high etch selectivity with respect to the trench fill material, and does not etch away as fast as the trench fill material during etching/cleaning steps (e.g., hydrofluoric acid wet clean) that would etch away the trench fill material. In other embodiments, the second liner 160 may be nitridized to prevent uptake of oxygen.

Figure 4G:
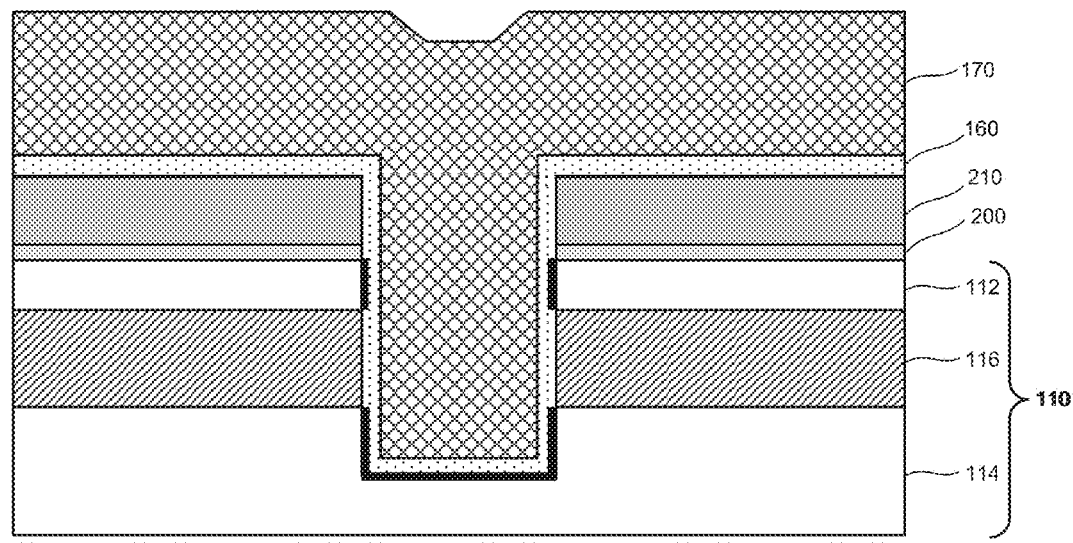
Figure 4H:
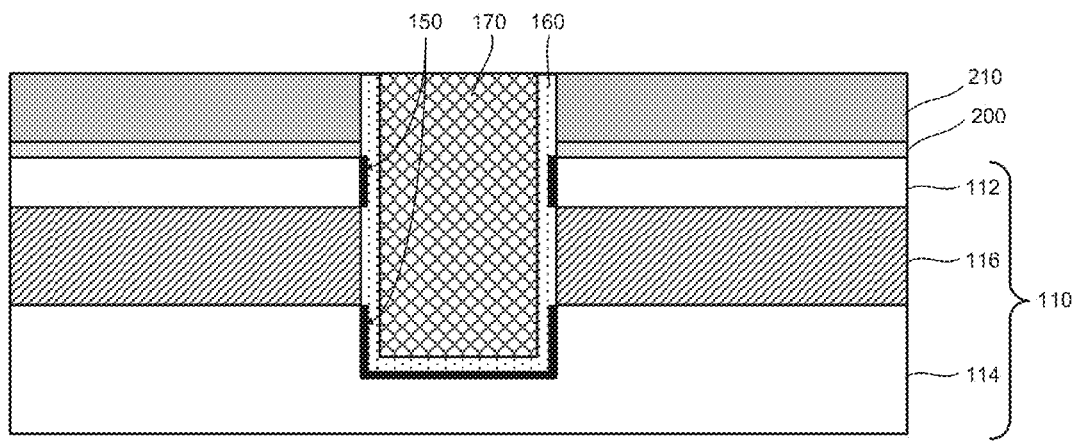

After depositing the second liner 160 layer, the shallow trench 140 is filled with an insulting trench fill material. FIG. 4G is a cross-sectional view of the structure of FIG. 4F after depositing a blanket layer of insulating material 170 to fill the shallow trench 140. The trench fill material 170 may be an oxide material, such as silicon dioxide formed using an SACVD or spin coating process, or HDP (high density plasma) oxide. After the depositing the blanket layer of trench fill material 170, the substrate surface is planarized down to the pad nitride layer 210 to remove the portions of the trench fill material 170 and second liner 160 on the surface of the substrate. FIG. 4H is a cross-sectional view of the structure of FIG. 4G after planarizing the surface of the structure to remove portions of the insulating trench fill material 170 and the second liner material 160 down to the pad nitride layer 210. In another embodiment of the invention, this planarization process can be performed to planarize the surface of the structure down to the pad oxide layer 200.

It is to be noted that the processing steps depicted in FIGS. 4A~4H are processing steps that can be sequentially performed as part of an exemplary process for fabricating each of the structures 100, 200 and 300 depicted in FIGS. 1, 2 and 3. However, the sequence of additional processing steps following the fabrication stage depicted in FIG. 4H will vary for the different structures depicted in FIGS. 1, 2 and 3. For illustrative purposes, the additional process steps depicted in FIGS. 4I~4L show an exemplary sequence of processing steps for constructing the structure 300 of FIG. 3.

Figure 4I:
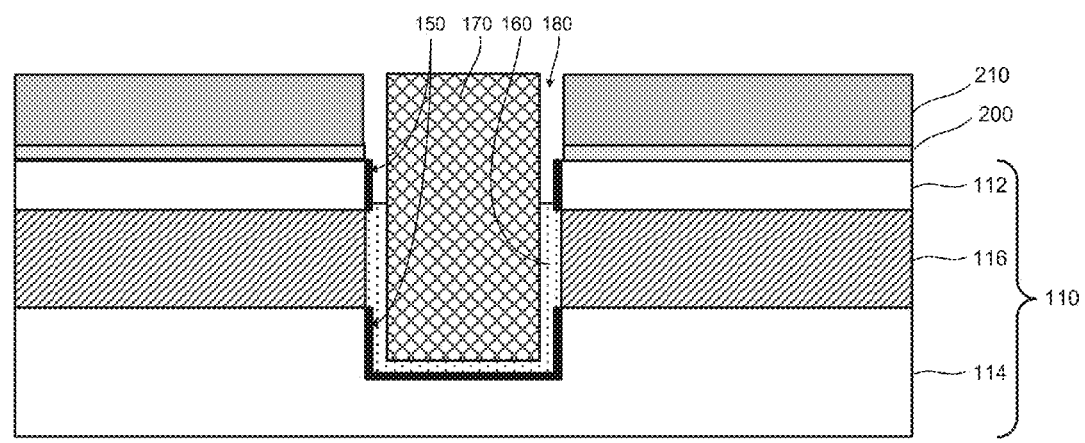

In particular, FIG. 4I is a cross-sectional view of the structure of FIG. 4H after performing a liner recess etch process to remove portions of the second liner material 160 present on the upper sidewalls of the shallow trench 140 and form a recess region 180 in an upper portion of the shallow trench 140. The liner recess etch process may be performed using a dry etch process using a $BCl_3$ dry chemistry. The second liner 160 may be recessed down to a level that does not extend past a bottom of the BOX layer 116. The recess etch process is preferably highly selective to the trench fill material 170 and the pad nitride layer 210 so that the trench fill material 170 is not significantly etched (although the pad nitride layer 210 can serves as a sacrificial layer in this process).

Figure 4J:
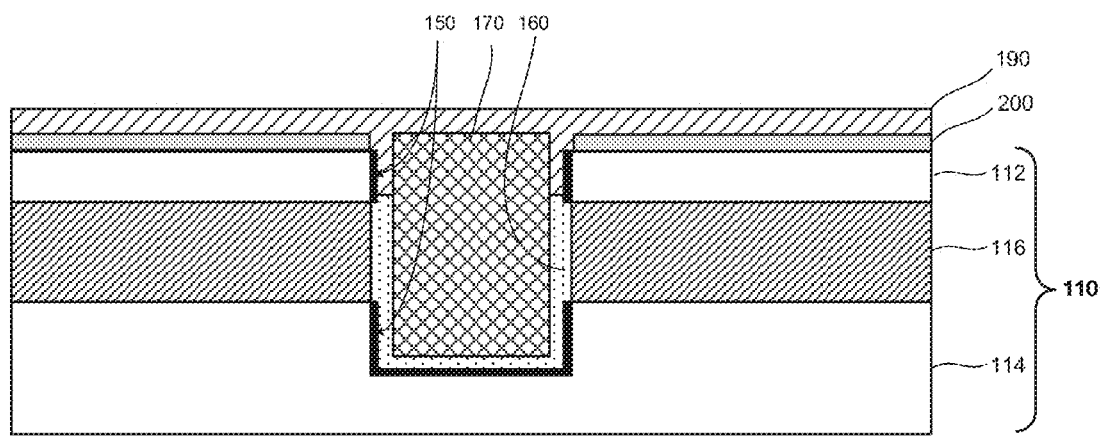

In a next phase of fabrication, FIG. 4J is a cross-sectional view of the structure of FIG. 4I after removing the pad nitride layer 210 and conformally depositing a layer of insulating material 190 to fill the recess region 180 within the shallow trench 140. The pad nitride layer 210 can be removed with a wet etch process using hydrophosphoric acid. The layer of insulating material 190 may be a layer of silicon nitride or any other material which does not conduct appreciable amount of oxygen. The layer of insulating material 190 may be conformally deposited using know techniques to fill the recess region 180. As noted above, the silicon nitride divot fill 190 isolates the second liner 160 and trench fill material 170 from a subsequently formed high-K gate dielectric layer and, thus prevents the flow of oxygen atoms to the high-K gate dielectric layer.

Figure 4K:
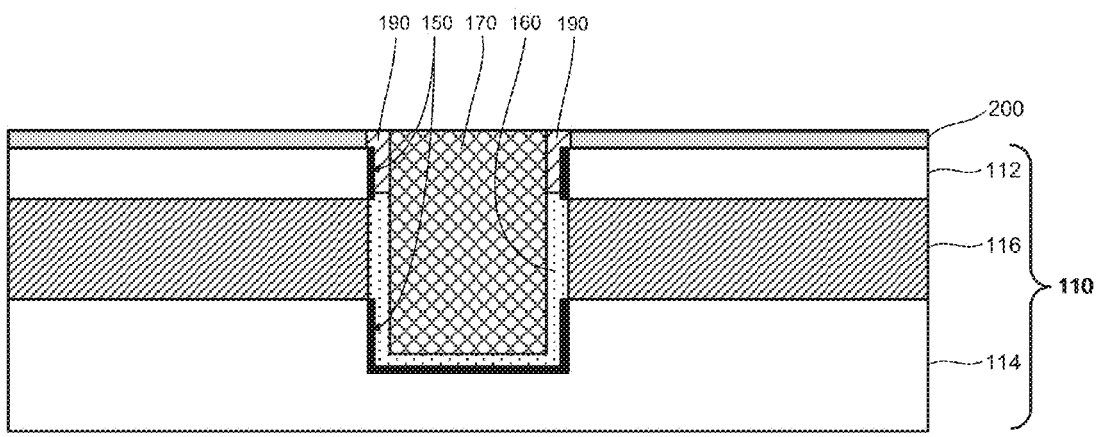

FIG. 4K is a cross-sectional view of the structure of FIG. 4J after removing the portion of the layer insulting material 190 (divot fill material) down to the pad oxide layer 200. The excess divot fill material may be removed from the top horizontal surface of the substrate using a dry directional etch back process or using a wet etch process to remove the divot fill material 190 selective to the trench fill material 170 and pad oxide layer 200.

Figure 4L:
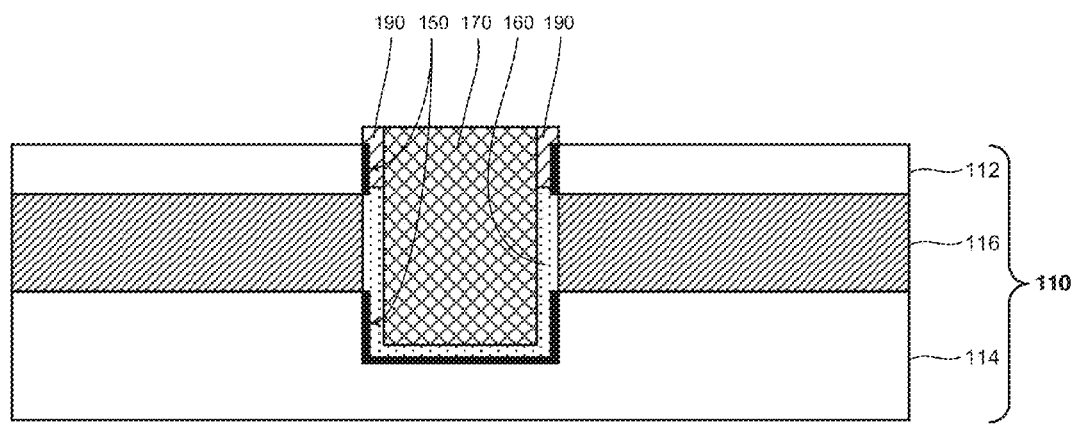
Figure 4M:
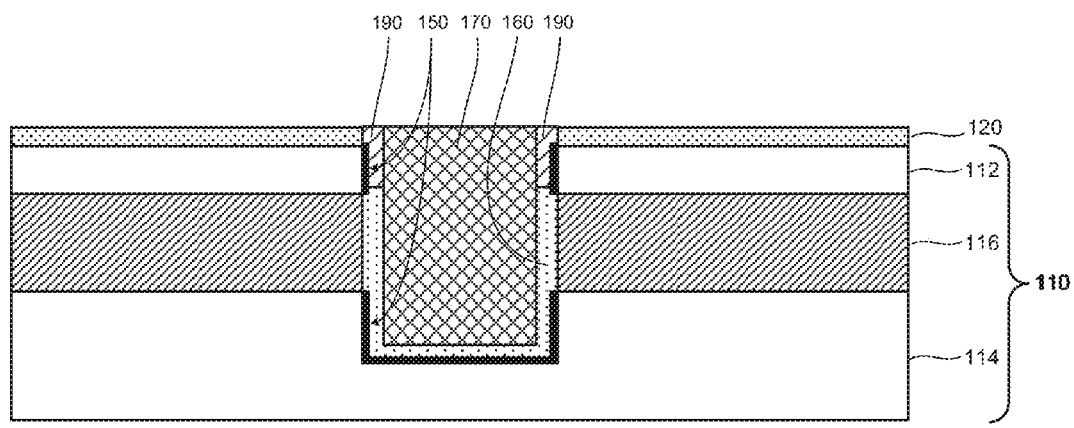

In a next phase of fabrication, FIG. 4L is a cross-sectional view of the structure of FIG. 4K after removing the pad oxide layer 200. In this process, the pad oxide layer 200 can be removed using any suitable oxide etch process. This etch process may result in some etching and recess of the trench fill material 170. However, the divot fill 190 and second trench liner 160 serve to protect the sidewalls of the shallow trench 140 in the event that the trench fill material 170 is etch and recessed with the pad oxide removal process and other etch/clean processing steps.

4M is a cross-sectional view of the structure of FIG. 4L after forming a gate dielectric layer 120 on top of the substrate surface. In one aspect of the invention, the gate dielectric layer 120 may formed using known materials and techniques. For instance, the gate dielectric layer 120 may comprise a stack of materials comprising a first, thin interfacial layer of dielectric/insulating material formed on the first silicon layer 112 and a second layer of high dielectric material formed on the first interfacial layer As discussed above, the divot fill 190 isolates the second liner 160 from the high k gate dielectric layer 120 to prevent diffusion of oxygen from the second liner 160 to the high k gate dielectric layer 120 and 210 and thereby prevent a significant shift in the threshold voltages caused by oxygen contamination of the high k gate dielectric layer 120.

As noted above, the processing steps for constructing the structures 100 and 200 of FIGS. 1 and 2 will vary. For instance, with regard to the structure of FIG. 1, starting from the stage of fabrication depicted in FIG. 4G, a combination of etch and/or planarizing processes can be performed to remove the layers of trench fill material 170, the second liner 160, the pad nitride 210, and the pad oxide layer 200 down to the first silicon layer 112. Thereafter, a gate dielectric layer 120 can be formed as discussed above with reference to FIG. 4L. The resulting structure 100 is depicted in FIG. 1, wherein the second trench liner 160 would be in contact with the gate dielectric layer 120.

Moreover, with regard to the structure 200 of FIG. 2, starting from the stage of fabrication depicted in FIG. 4G, a combination of etch and/or planarizing processes can be performed to remove the layers of trench fill material 170, the second liner 160, and the pad nitride 210 down to the pad oxide layer 200. Thereafter, a recess process such as discussed above with reference to FIG. 4I could be performed to recess the second liner material 160 to form a recess region 180. This liner recess process could then be followed by a pad oxide removal and formation of the gate dielectric layer 120 as discussed above with reference to FIG. 4L. The resulting structure 200 is depicted in FIG. 2, wherein the second trench liner 160 is isolated from the gate dielectric layer 120 by the recess region 180.

It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor device. For convenience of explanation and not intended to be limiting, the semiconductor devices and methods of fabrication are described herein for silicon semiconductors but persons of ordinary skill in the art will understand that other semiconductor materials can also be used.

Further aspects of the present invention provide STI structures that can be utilized in integrated circuit chips with various analog and digital integrated circuitries. In particular, integrated circuit dies can be fabricated having STI structures formed in UTBB substrates to isolate active regions for semiconductor devices such as field-effect transistors, bipolar transistors, metal-oxide-semiconductor transistors, diodes, resistors, capacitors, inductors, etc., forming analog and/or digital circuits. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although the exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a silicon-on-insulator (SOI) semiconductor substrate comprising a first silicon layer, a second silicon layer, and a buried oxide layer disposed between the first silicon layer and the second silicon layer;
   a high-K gate dielectric layer formed on the first silicon layer;
   a shallow trench isolation structure formed in the semiconductor substrate, the shallow trench isolation structure comprising:
      a shallow trench formed through the first silicon layer, the buried oxide layer and partially through the second silicon layer;
      a first liner formed on exposed surfaces of the first and second silicon layers in the shallow trench;

a second liner conformally lining a bottom and lower sidewalls of the shallow trench, wherein the second liner contacts the first liner and contacts an exposed surface of the buried oxide layer in the shallow trench; and a trench till material disposed in the shallow trench, wherein the second liner is formed of a material having etch selectivity with regard to the trench fill material, the second liner being recessed below an upper surface of the first silicon layer to provide a void of the second liner in an upper region of the shallow trench; and an insulating material filling the void in the upper region of the shallow trench between the first liner and the trench fill material such that the insulating material is in contact with the trench fill material, the second liner and the high-k dielectric layer and isolates the trench fill material and the second liner from the high-k gate dielectric layer.

2. The semiconductor device of claim 1, wherein the second liner is a high-k dielectric liner.

3. The semiconductor device of claim 1, wherein the first liner is formed of oxynitride.

4. The semiconductor device of claim 1, wherein the insulating material is a material that does not conduct an appreciable amount of oxygen.

5. The semiconductor device of claim 1, wherein the insulating material comprises silicon nitride.

6. The semiconductor device of claim 1, wherein a thickness of the buried oxide layer is in a range of about 5 nm to about 75 nm.

7. The semiconductor device of claim 1, wherein the trench till material comprises an oxide material.

8. The semiconductor device of claim 1, wherein a thickness of the first silicon layer is about 5 nm to about 25 nm.

9. The semiconductor device of claim 1, wherein the second liner comprises hafnium silicate.

10. The semiconductor device of claim 1, wherein the second liner comprises hafnium oxide.

11. The semiconductor device of claim 1, wherein the second liner comprises $TiO_2$.

12. The semiconductor device of claim 1, wherein the first liner comprises a thermal oxide that is grown on the exposed surfaces of the first and second silicon layers in the shallow trench.

* * * * *